(12) United States Patent
Yo et al.

(10) Patent No.: US 6,461,484 B2
(45) Date of Patent: Oct. 8, 2002

(54) SPUTTERING DEVICE

(75) Inventors: Kamikura Yo; Naoki Yamada; Terushige Takeyama; Shuji Kumagai, all of Tokyo (JP)

(73) Assignee: Anelva Corporation, Fuchu (JP)

(*) Notice: Subject to any disclaimer, the term of this patent is extended or adjusted under 35 U.S.C. 154(b) by 0 days.

(21) Appl. No.: 09/931,852

(22) Filed: Aug. 20, 2001

(65) Prior Publication Data

US 2002/0029959 A1 Mar. 14, 2002

(30) Foreign Application Priority Data

Sep. 13, 2000 (JP) ........................................ 2000-278962

(51) Int. Cl.⁷ .............................................. C23C 14/34
(52) U.S. Cl. ............................ 204/192.12; 204/298.12; 204/298.18; 204/298.2; 204/298.23; 204/298.26; 204/298.27
(58) Field of Search ......................... 204/192.1, 192.12, 204/298.12, 298.18, 298.2, 298.22, 298.23, 298.26, 298.27, 298.28

(56) References Cited

U.S. PATENT DOCUMENTS

| | | | | | |
|---|---|---|---|---|---|
| 5,207,884 A | * | 5/1993 | Char et al. | ............ | 204/298.28 |
| 5,762,766 A | * | 6/1998 | Kurita et al. | ............ | 204/192.2 |
| 6,290,826 B1 | * | 9/2001 | Obinata et al. | ........ | 204/298.28 |

FOREIGN PATENT DOCUMENTS

| | | | | | |
|---|---|---|---|---|---|
| JP | 62 017 175 A | * | 1/1987 | ............ | 204/298.18 |
| JP | 62 179 115 A | * | 8/1987 | ............ | 204/298.18 |
| JP | 63 000 465 A | * | 1/1988 | ............ | 204/298.23 |
| JP | 63 060 275 A | * | 3/1988 | ............ | 204/298.26 |
| JP | 64 073 075 A | * | 3/1989 | ............ | 204/298.04 |
| JP | 02-094677 | | 4/1990 | | |
| JP | 02-212351 | | 8/1990 | | |
| JP | 03-103308 | | 4/1991 | | |
| JP | 03-137006 | | 6/1991 | | |
| JP | 03-274775 | | 12/1991 | | |
| JP | 03-276685 | | 12/1991 | | |
| JP | 04-116164 | | 4/1992 | | |
| JP | 04-228498 | | 8/1992 | | |
| JP | 04-310596 | | 11/1992 | | |
| JP | 04 371 577 A | * | 12/1992 | ............ | 204/298.15 |
| JP | 05-009030 | | 1/1993 | | |
| JP | 05-139893 | | 6/1993 | | |
| JP | 06 116 721 A | * | 4/1994 | ............ | 204/298.23 |
| JP | 08-274142 | | 10/1996 | | |
| JP | 11-091945 | | 4/1999 | | |
| JP | 11-091946 | | 4/1999 | | |
| WO | WO 94/19508 | * | 9/1994 | | |

* cited by examiner

*Primary Examiner*—Patrick Ryan
*Assistant Examiner*—Gregg Cantelmo
(74) *Attorney, Agent, or Firm*—Burns, Doane, Swecker & Mathis, LLP

(57) ABSTRACT

A sputtering device is provided in which at least one target is sputtered by sputtering discharge to produce a film of target material on at least the first surface of a substrate. The sputtering device has a principal rotating mechanism that rotates the at least one target about an axis of revolution coaxial with the central axis of the substrate. The target is positioned offset from and circumferential to the central axis of the substrate coaxial with the axis of revolution. A magnet mechanism for magnetron discharge of the sputtering discharge forms a magnetic field asymmetrical to a central axis of the target and is rotated by an auxiliary rotating mechanism. The principal rotating mechanism integrates rotation of the targets with the magnet mechanism.

27 Claims, 8 Drawing Sheets

SPUTTERING DEVICE

CROSS-REFERENCE TO RELATED APPLICATIONS

This application claims benefit of priority from Japanese Patent Application No. 2000-278962 filed Sep. 13, 2000, the entire contents of which are herein incorporated by reference.

BACKGROUND

1. Field of the Invention

The present invention is directed to a sputtering device for producing a predetermined film on the surface of a substrate and, more particularly, it relates to a sputtering device suitable for film deposition using a plurality of targets of different materials.

2. Discussion of Related Art

In the description of the background of the present invention that follows reference is made to certain structures and methods, however, such references should not necessarily be construed as an admission that these structures and methods qualify as prior art under the applicable statutory provisions. Applicants reserve the right to demonstrate that any of the referenced subject matter does not constitute prior art with regard to the present invention.

The production of predetermined films on the surface of a substrate is widely performed in the manufacture of electronic devices, such as large scale integrated circuits (LSI) and display devices such as liquid crystal displays (LCD). Sputtering devices are widely used for film production because they can produce a quality film at high speed. An important characteristic demanded of sputtering devices is the production of uniform films. Generally, non-uniform film thickness and film quality lowers performance of the product that is manufactured using said film.

The difficulty of forming a uniform sputtering discharge in the direction of the surface of the substrate is one factor contributing to the reduction of film uniformity. In addition, where a magnet mechanism is provided for magnetron discharge, forming of a uniform magnetic field from the magnet mechanism in the direction of the substrate can be difficult and is a factor contributing to the reduction of film uniformity.

To overcome this drawback and others and to ensure film uniformity, a structure that rotates the substrate about an axis of revolution coaxial with the center of the target can be used. However, some manufacturing processes do not enable rotation of the substrate, i.e., for mechanical reasons.

OBJECTS AND SUMMARY

An object of the present invention, which is designed to solve the problems noted above, possesses technological significance in that it can produce a uniform film without need for rotation of the substrate.

A sputtering device is provided in which at least one target is sputtered by sputtering discharge to produce a film of target material on at least a first surface of a substrate. The sputtering device has a principal rotating mechanism that rotates the at least one target about an axis of revolution coaxial with the central axis of the substrate. The target is positioned offset from the central axis of the substrate. In another aspect of the present invention, a plurality of targets are provided on a circumference coaxial with the axis of revolution. Power for the sputtering discharge on each of the plurality of targets is supplied and can be independently controlled by a power supply system.

The sputtering device can be further provided with a magnet mechanism for the magnetron discharge of the sputtering discharge. The principal rotating mechanism can integrate rotation of the targets with the magnet mechanism. The magnet mechanism can form a magnetic field asymmetrical to a central axis of the target and can be rotated by an auxiliary rotating mechanism about the central axis of the target. The magnet mechanism can be rotated by using the rotational power of the principal rotating mechanism.

The targets and the principal rotating mechanism can form a cathode unit disposed in vertical opposition to each of the first and second surfaces of the substrate.

In an additional embodiment, the targets can be positioned inclined at a predetermined angle to the substrate.

BRIEF DESCRIPTION OF THE DRAWING FIGURES

Other objects and advantages of the invention will become apparent from the following detailed description of preferred embodiments in connection with the accompanying drawings in which like numerals designate like elements and in which.

DETAILED DESCRIPTION OF THE PREFERRED EMBODIMENTS

Figure 1:
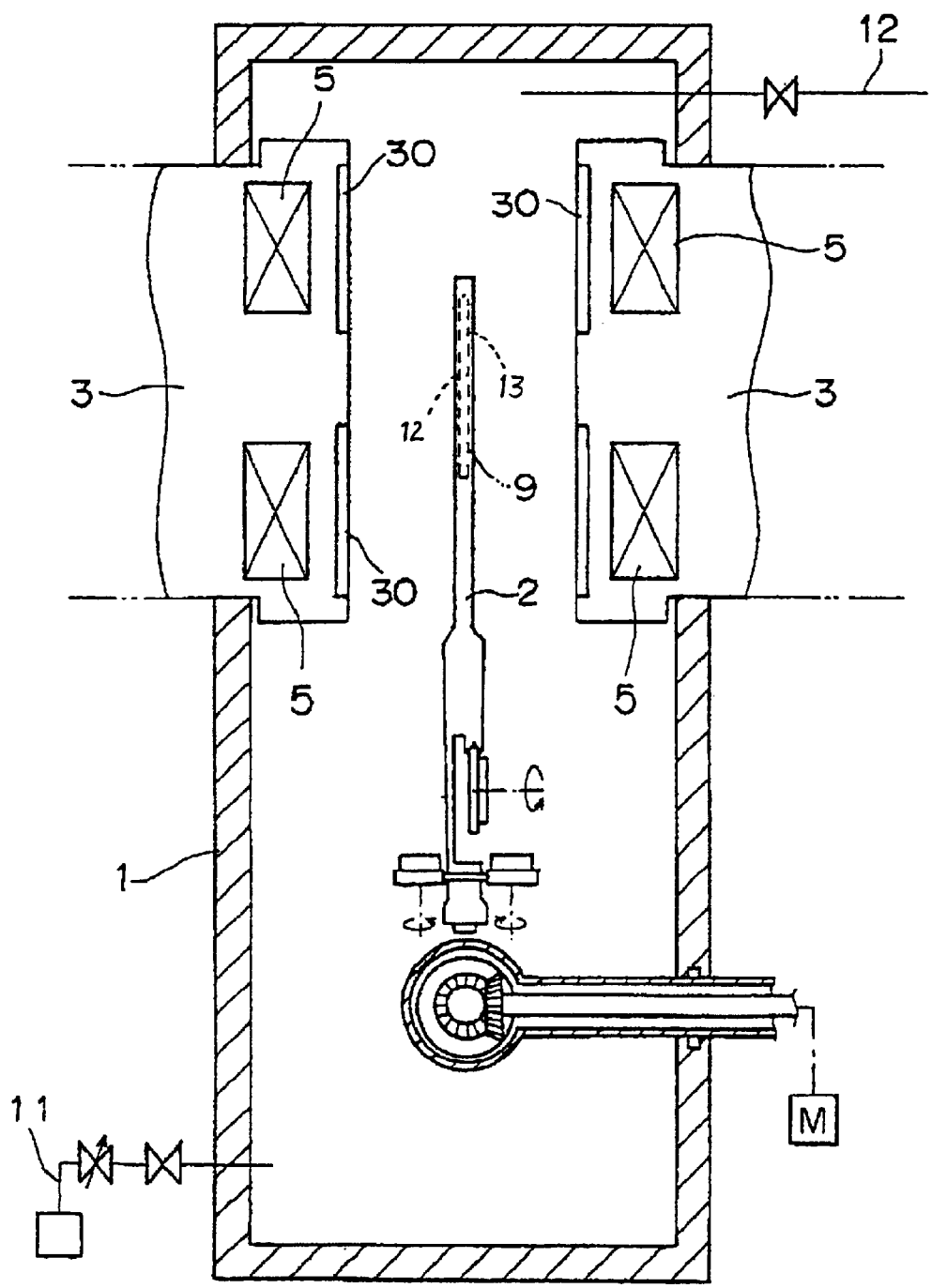
FIG. 1 is a cross-sectional schematic view of the sputtering device of a first embodiment in keeping with the invention of the present application.

FIG. 1 is a cross-sectional schematic view of a sputtering device of an exemplary embodiment of the invention of the present application. The device shown in FIG. 1 is principally configured from a sputtering chamber 1 which is provided with an exhaust system 11, a substrate carrier 2 for the deployment of a substrate 9 in a predetermined position within the sputtering chamber 1, and a cathode unit 3 for generating a sputtering discharge.

The sputtering chamber 1, which is an airtight vacuum container, is provided with an opening (not shown in the diagram) for the insertion and removal of the substrate 9. This opening is opened and closed by a gate valve not shown in the diagram.

A gas introducing system 12 introduces a gas for sputtering discharge into the interior of the sputtering chamber 1. The gas introducing system 12 can introduce a gas of high sputtering rate, such as argon.

A substrate carrier 2 supports the substrate 9 in a desired orientation. Any suitable substrate carrier can be used. For example, the substrate carriers disclosed in Japanese Unexamined Patent Application No. Heisei 11-91945 and Japanese Unexamined Patent Application No. Heisei 11-91946 can be used.

In the exemplary embodiment of FIG. 1, cathode units 3 are deployed on each side of the substrate 9. The position of the cathode units 3 allow for simultaneous film deposition on both a first surface 12 and a second surface 13 of the substrate 9. A cathode unit 3 comprises at least one target 30 and a magnet mechanism 5. The cathode units 3 are each arranged such that the target 30 is substantially vertically opposed to a respective first surface 12 or second surface 13 of the substrate 9.

Figure 2:
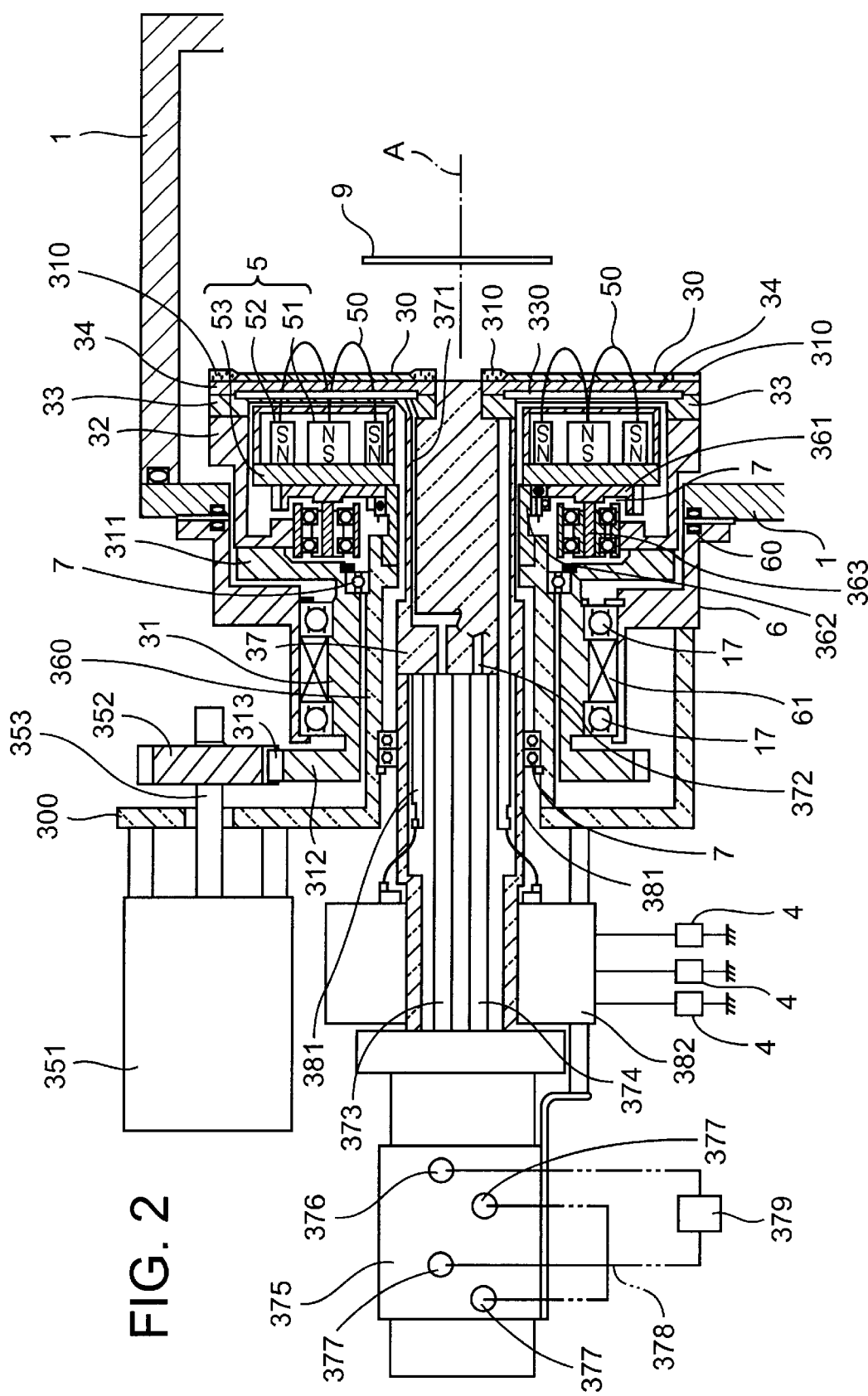
FIG. 2 is a cross-sectional view showing the details of the cathode unit.

FIG. 2 is a cross-sectional view that shows the structural details of a cathode unit 3 as shown in FIG. 1. The left/right cathode units 3 shown in FIG. 1 are identical structures (symmetrical structures positioned in each side of the substrate 9), and FIG. 2 shows the details of the cathode unit 3 on the left side thereof.

An opening slightly larger than the cross sectional area of the cathode unit 3 is provided in a sidewall part of the sputtering chamber 1. The cathode unit 3 is inserted in this opening. A unit-attaching frame 6 is fixed to the outer surface of the sidewall part of the sputtering chamber 1. The unit-attaching frame 6 has, as shown in FIG. 2, a cross-sectional cylinder shape with level differences. The end surface of the unit-attaching frame 6 is fixed to the outer surface of the sidewall part of the sputtering chamber 1 by way of a sealing member 60 such as an O-ring.

A principal holder 31 is provided on the inner side of the unit-attaching frame 6. The principal holder 31, which is approximately cylindrical, is provided coaxially with the unit-attaching frame 6. Hereinbelow, the central axis of the principal holder 31, shown as A in FIG. 2, is referred to as the 'standard axis'. The substrate carrier 2 described above is designed in such a way that the central axis of the substrate 9 is stationary in a state in which it is coincident with the standard axis A and such that the surfaces of the substrate are substantially perpendicular to the standard axis.

A right holder flange 311 is provided in the right side end part of the principal holder 31. A cathode-attaching frame 32 is fixed to the right holder flange 311. The cathode-attaching frame 32, which has an approximately cylindrical shape in the cross-section, as shown in FIG. 2, is provided coaxially with the standard axis A.

The right side end surface of the cathode-attaching frame 32 is positioned within the sputtering chamber 1, and a cavity plate 33 is fixed in the end surface thereof. A backing plate 34 is affixed to the cavity plate 33. The target 30 is attached to the backing plate 34, so as to be freely attachable and detachable, by a target presser 310. That is to say, from the left, in order, the cavity plate 33, backing plate 34 and target 30 are overlaid on each other and fixed to the right end side of the cathode-attaching frame 32. It will be noted that the cavity plate 33 and backing plate 34 are of an approximate disk shape that is slightly larger than the target 30.

Figure 3:
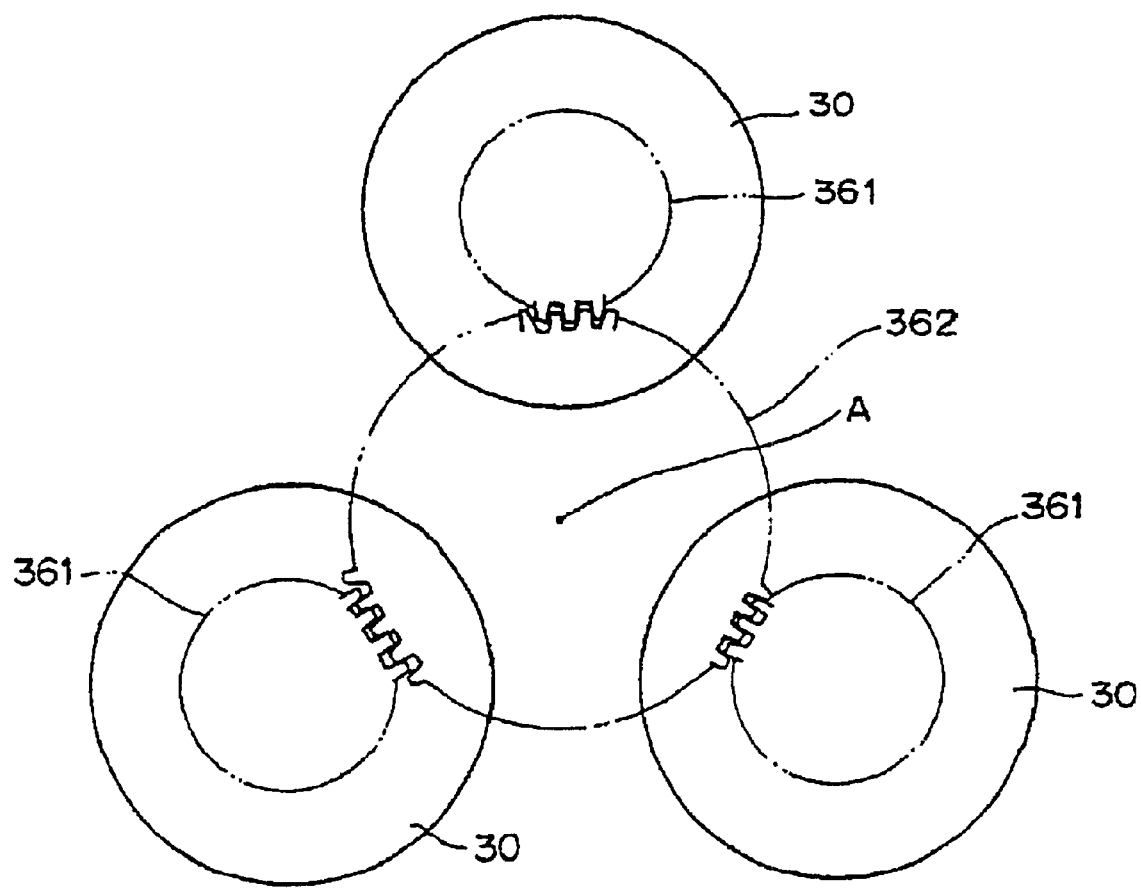
FIG. 3 is a side schematic view that describes the positional arrangement and shape of the target.

FIG. 3 is a side schematic view that describes the positional arrangement and shape of the target 30. As shown in FIG. 3, the exemplary embodiment has three targets 30 provided in each one of the two cathode units 3, 3'. The targets 30 are of a disk shape and are of substantially equal size. The targets 30 are arranged equidistant (that is to say, every 120°) on the circumference of a circle centered on the standard axis A. The cavity plate 33 constitutes a shape that forms, together with the backing plate 34, a cavity 330. A coolant is supplied to this cavity 330 as described below.

The sputtering device of the exemplary embodiment is provided with a principal rotating mechanism that affords the rotation of the targets 30 about an axis of revolution coaxial with the center of the substrate 9 (that is to say, about the standard axis A). The principal rotating mechanism is, as shown in FIG. 2, configured from the above-noted principal holder 31 and a rotational drive source 351, such as a motor, that affords the rotation of the principal holder 31 and so on.

More specifically, a left holder flange 312 is provided in the left side end part of the principal holder 31. The circumferential surface 313 of the left holder flange 312 is formed as gear teeth (hereinbelow, flange-side gear teeth). A drive gear 352, which comprises gear teeth that mesh with the flange-side gear teeth, is coupled with the output shaft of the rotational drive source 351. When the rotational drive source 351 is driven, the principal holder 31 rotates about the standard axis A by way of the drive gear 352.

The unit-attaching frame 6 supports the principal holder 31. A bearing 7 is provided between the unit-attaching frame 6 and principal holder 31, wherein the rotation of the above-noted principal holder 31 is permitted.

A magnet mechanism 5 is housed in the cathode unit-attaching frame 32 at the rear of each of the targets 30. The magnet mechanism 5 is principally configured from a perimeter magnet 52, which surrounds a center magnet 51, and a yoke 53 which links the center magnet 51 and the perimeter magnet 52. A magnetic line 50, from the center magnet 51 and perimeter magnet 52, penetrates the target 30 forming an arc shape in the front discharge space of the target 30 as shown in FIG. 2. While magnetron motion occurs, electrons are locked into the closed space formed by the target 30 and the magnetic line 50, wherein a highly efficient magnetron discharge is achieved.

The yoke 53, which is a disk shape and slightly smaller than the target 30, is provided vertically upright. The center magnet 51 is, by way of example, a columnar shape, and the perimeter magnet 52 is, by way of example, a toroid shape. Although the central axis of the yoke 53 and the central axis of the target 30 are coaxial, the deployment and shape of the center magnet 51 and the perimeter magnet 52 are asymmetrical to the central axis of the target 30. That is to say, the magnetic field formed by the magnet mechanism 5 is asymmetrical to the central axis of the target 30. This is because, when the magnet mechanism 5 is rotated as described below, the average magnetic strength on the surface of the target 30 is uniform over time.

The sputtering device of the exemplary embodiment is provided with an auxiliary rotating mechanism that affords the rotation of the magnet mechanism 5 about an axis of revolution coaxial with the central axis of the target 30. The auxiliary rotating mechanism affords the rotation of the magnet mechanism 5 using the rotational power of the above-described principal rotating mechanism.

In a more specific description and referenced to FIG. 3, the auxiliary rotating mechanism is principally configured from a subjugated gear 361, provided in the magnet mechanism 5, and a stationary gear 362 that converts the rotational power of the principal rotating mechanism to the rotational power of the magnet mechanism 5.

The subjugated gear 361 is fixed to the lower surface of the yoke 53 and is coaxial with the central axis of the target 30. An axial pole 363 is fixed so as to extend horizontally from the center of the subjugated gear 361, away from the yoke 53 and interposed coordinately with a bearing 7, such that the axial pole 363 is supported by the cathode-attaching frame 32.

On the other hand, the rotational drive source 351 of the principal rotating mechanism described above is attached to a base plate 300 provided vertically. A spindle opening, in which a spindle 353 is inserted, is provided in the base plate 300. A gear holder 360 is provided in such a way as to extend horizontally from the end of the spindle opening. The gear holder 360, which is approximately cylindrical in shape, is coaxial with the standard axis A.

The stationary gear 362 is fixed to the tip end of the gear holder 360. The gear teeth of the stationary gear 362, which are coaxial with the standard axis A, face toward the outer side with respect to the standard axis A. As shown in FIG. 2, the stationary gear 362 is meshed with the subjugated gears 361. The positional relationship and meshing of the stationary gear 362 and the subjugated gears 361 are shown together in FIG. 3.

As can be seen from FIG. 2 and FIG. 3, because the magnet mechanisms 5 are coupled with the cathode unit-attaching frame 32 by way of an axial pole 363, the principal holder 31 is rotated by the rotational drive source 351. Also, when the targets 30 are rotated about the standard axis A, the magnet mechanisms 5 and subjugated gears 361 are rotated integrally about the standard axis A (hereinbelow, the rotation about the standard axis A is referred to as revolving). Because the subjugated gears 361 mesh with the stationary gears 362 in a position on the standard axis A, when the above-noted revolution occurs, the subjugated gears 361 are rotated about the central axis coaxial with the target 30 (hereinbelow, this rotation is referred to as turning). Accompanying the turning of the stationary gears 361, the magnet mechanism 5 is also integrally turned. In the end, the magnet mechanism 5 simultaneously performs a revolution about the standard axis A and a turning about the central axis of the target 30. It will be noted that a bearing 17 is provided between the gear holder 360 and the unit-attaching frame 6.

Main spindle 37 is provided in such a way as to penetrate the center of the principal holder 31. The main spindle 37 supports a backing plate 34 and cavity plate 33 at the tip end section. The right side section of the main spindle 37 is columnar, and the left side section, of approximately the same diameter, is cylindrical.

A coolant supply path 371, for introducing coolant to the cavity 330, is provided in the right side section of the main spindle 37 (hereinbelow the columnar part). The coolant supply path 371 branches into three along its length, and the first of these branches connects to the cavity 330 at the rear of the targets 30. In addition, a coolant discharge path 372, for discharging the coolant from the cavities 330, is provided in the columnar part. Although not clear from FIG. 2, three coolant discharge paths 372 are provided for each of the cavities 330.

A coolant discharge pipe 374, which leads to a coolant discharge path 372, and a coolant supply pipe 373, which leads to a coolant supply path 371, are provided in the cylinder shaped section on the left side of the main spindle 37 (hereinbelow the cylindrical part). In FIG. 2, although only one has been drawn, coolant discharge pipes 374 are provided in each of the coolant discharge paths 372.

In addition, a feed rod 381 is provided so as to pass though the columnar part and cylinder part of the main spindle 37. The feed rod 381 supplies power for sputtering discharge to the targets 30. In FIG. 2, although only one feed rod 381 is drawn, three feed rods 381 are actually provided. The distal tip end of the feed rod 381 contacts the cavity plate 33. The cavity plate 33 and backing plate 34 are made of a conductive metal, such as copper, and electricity is supplied to the target 30 by way of the cavity plate 33 and backing plate 34. It will be noted that, between the feed rod 381 and the main spindle 37 and, between the cavity plate 33, backing plate 34 and the main spindle 37, an insulating material (not shown in the diagram) is provided. For this reason, the power that is supplied by the feed rod 381 is not leaked to the main spindle 37 side.

Figure 4:
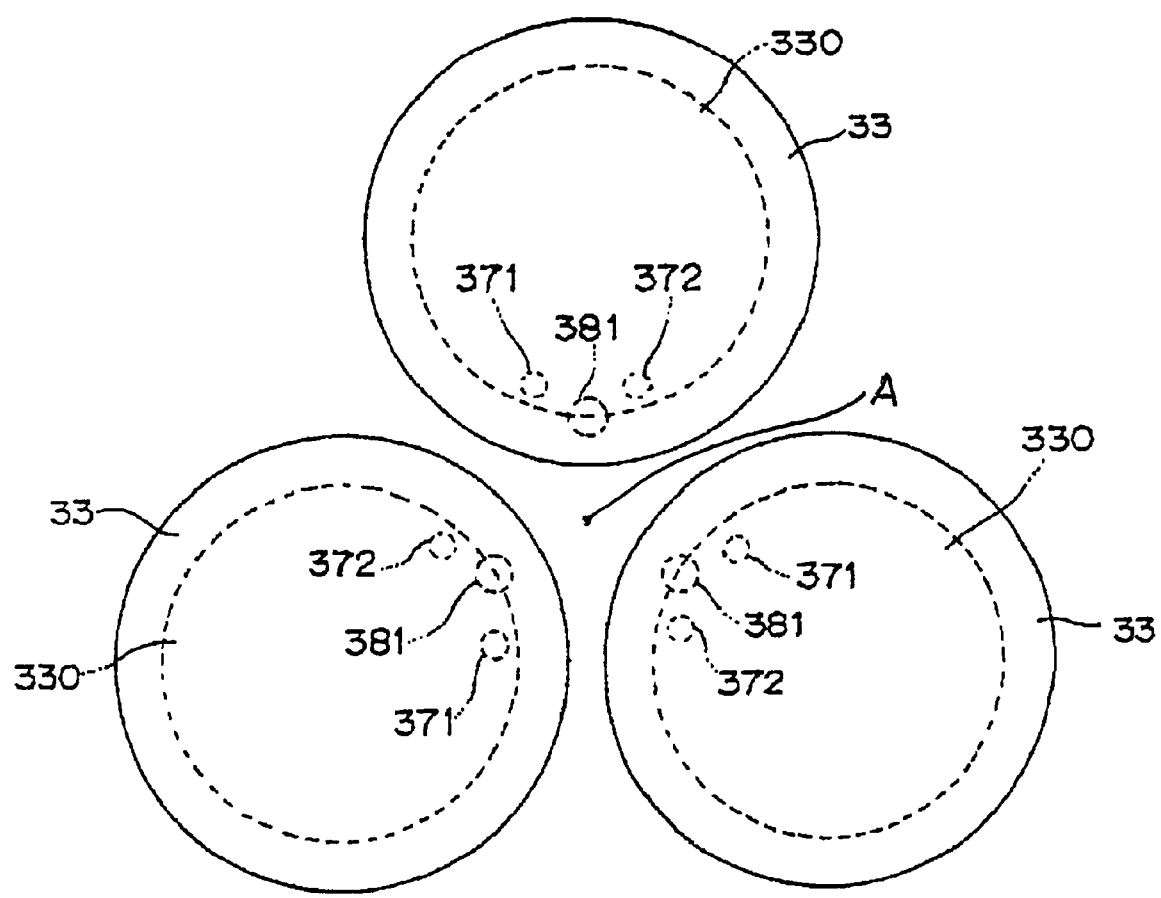
FIG. 4 is a side schematic view locating the power supply feed position and coolant supply and discharge positions.

FIG. 4 is a side schematic view that describes the power supply feed position and supply and discharge positions of the coolant. The feed rod 381 contacts the cavity plate 33 at a position along the circumference of cavity 330 at its closest tangent point to standard axis A. The coolant supply path 371 and coolant discharge path 372 are in diagonal relationship to the feed rod 381 each along on arc of cavity 330 and symmetric with respect to feed rod 381.

Accompanying the above-described revolution, the main spindle 37 also revolves about the standard axis A. Slip ring 382 and rotary joint 375 provide power supply and coolant flow, respectively, irrespective of the revolution of the main spindle 37.

As is shown in FIG. 2, the slip ring 382 is provided in such a way as to surround the right side end part of the main spindle 37. The slip ring 382 is wired to each feed rod 381 by a cable. Three sputtering power sources 4, provided to correspond to the respective targets 30, are connected to the slip ring 382. The sputtering power source 4 is designed and the sputtering device configured so as to be able to adjust the output voltages independently, and thereby control independently the power supplied to each of the targets 30. The slip ring 382 affords the contact of a plate spring-shaped member to the exterior surface of the rotating cylinder body to provide electrical contact. By way of example, an "φ 150-60 3ch SR" or the like manufactured by Grope-Chuck K.K may be used as the slip ring 382.

As shown in FIG. 2, the rotary joint 375 is connected to the left side end part of the main spindle 37. A coolant supply opening 376, leading to the coolant supply pipe 373, and three coolant discharge outlets 377, leading to respective coolant discharge pipes 374, are provided in the rotary joint 375, that is designed, irrespective of the rotation of the main spindle 37, to provide fluid between the coolant supply pipe 373 and the coolant supply inlet 376, and to provide fluid communication between each of the coolant discharge pipes 374 and the respective coolant discharge outlet 377. By way of example, a rotary joint KT-4-02-1W manufactured by Koyu Yuatsu K.K may be used as the rotary joint 375.

The coolant supply inlet 377 and coolant discharge outlet 376 of the above-noted rotary joint 375 are, as shown in FIG. 2, connected by way of a pipe 378 and circulator 379. The coolant, which is maintained at a predetermined temperature by the circulator 379, is introduced to the cavities 330 via the coolant supply pipe 373 and coolant supply path 371 and is returned from the cavity 330 to the circulator 379 via the coolant-discharge path 372, coolant-discharge pipe 374 and coolant-discharge outlet 377.

A sealing member such as an O-ring is provided in the necessary position in the above-noted cathode unit 3 structure in such a way as to prevent a leak of the vacuum maintained within the sputtering chamber 1. In the exemplary embodiment shown in FIG. 2, a magnetic fluid seal 61 is employed between the unit-attaching frame 6 and the principal holder 31. The magnetic fluid seal 61, which is a sealing member that uses a magnetic fluid, prevents leakage from the space between the principal holder 31 and the unit-attaching frame 6 while permitting rotation of the principal holder 31.

The sputtering device of the exemplary embodiment can be an inline type device in which a plurality of vacuum chambers, which include the above described sputtering chamber 1, are connected along a transportation line for the substrate 9. The disclosure given in Japanese Unexamined Patent Application No. Heisei 8-274142 can be used as reference for the layout and structure of such vacuum chambers.

In addition, in a state in which the substrate 9 is supported, the substrate carrier 2 moves to the vacuum chambers to execute the transfer of the substrate 9. With regard to the details of the configuration for the transfer of the substrate 9, a structure the same as that disclosed in Japanese Unexamined Patent Application No. Heisei 8-274142 can be employed.

A method of operation of a sputtering device is provided. In the method, the substrate 9 is mounted on the substrate carrier 2 in a load lock chamber not shown in the diagram, and moves to a pre-heating chamber (not shown in the diagram) wherein pre-heating of the substrate 9 is performed. Following this, the substrate carrier 2 is moved to the sputtering chamber 1 shown in FIG. 1 and FIG. 2. The substrate carrier 2 is stopped in a position in which the central axis of the substrate 9 is coincident with the standard axis A.

The rotational drive source 351 is operated and, as described above, the revolution of the target 30 and the magnet mechanism 5, as well as the turning of the magnet mechanism 5, is initiated. The turning speed is 1–1.2 times the revolution speed. For example, in the exemplary embodiment shown, the revolution speed is of the order of 100 to 200 rpm, and the turning speed is of the order of 150 to 300 rpm. It should be noted, however, that the exact ratio of turning speed to revolution speed will be determined by the relative sizes and gearing of the auxiliary rotation mechanism and the principal rotation mechanism.

In addition, the sputtering chamber 1 is exhausted in advance to a predetermined pressure by an exhaust system 11. After a gate valve (not shown in the diagram) is closed, a predetermined gas is introduced in a predetermined flow amount by a gas introducing system 12. In this state, the sputtering power source 4 is operated and a prescribed voltage is imparted to the target 30 by way of the feed rods 381. This voltage is a negative high voltage or high frequency voltage.

By the imparting of this voltage, a magnetic field is formed between the substrate 9 and the target 30, and a sputtering discharge is produced. In the process of sputtering discharge, particles (ordinarily atoms) are emitted from the surface of the targets 30 in which a collision of ions has occurred. The emitted particles (sputtered particles) arrive at the surface of the substrate 9 and, by the overlapping thereof, the film is accumulated.

Sputtering is performed for the time required for the film to reach a desired thickness, and the operation of the sputtering power source 4, gas introducing system 12 and rotational drive source 351 is stopped. The exhaust system 11 exhausts the sputtering chamber 1 again, after which the substrate carrier 2 is moved and the substrate 9 is transferred from the sputtering chamber 1. Following this, the substrate carrier 2 is moved to an unload lock chamber (not shown in the diagram) and the substrate 9 on which the film has been produced is recovered from the substrate carrier 2.

In the above-noted operation, because the target 30, with respect to the stationary substrate 9, is rotated about an axis of revolution coaxial with the central axis of the substrate 9, a film of uniform thickness and quality is produced on the surface of the substrate 9. That is to say, in a case in which the target 30 is not rotated, the production of film will be non-uniform as a result of the effect of the shape and so on of the magnetic field from the magnet mechanism 5, and because of the positional relationship between the target 30 and the substrate 9. Although the non-uniformity of the film would be removed by the effect of the positional relationship between the target 30 and the substrate 9 in an arrangement opposing the coaxial arrangement of the substrate 9 and the target 30, this is impossible in a case in which, as given in the present embodiment mode, a plurality of targets 30 are simultaneously used.

In addition, the uniformity in distribution of the magnetic field from the magnet mechanism 5 in the surface of the substrate 9 in the parallel surface direction is difficult and, in the case in which the magnet mechanism 5 is not revolved, the distribution of the magnetic field, the film deposition speed and film quality are affected leading to non-uniformity. In the present embodiment mode, in which the magnet mechanism 5 is revolved, there are no such problems.

The configuration in which the magnet mechanism 5 is revolved integrally with the target 30 is technologically significant in that the magnetic field from the magnet mechanism 5 is used without wastage. Moreover, in the case in which the magnet mechanism 5 is not revolved, the target 30 is sputtered as it passes along the front of a static magnet mechanism 5. In such a system, as the target is rotated 360°, the effect of the magnetic field can be utilized only in a certain restricted range of angles, and the utilization efficiency of the magnetic field is lowered. As a result, the overall film deposition rate is lowered. In contrast, the present embodiment integrally revolves the magnet mechanism 5 with the target 30 and there is no such problem. The effect of the revolution of the above-noted target 30 and the magnet mechanism 5 is especially marked in a case in which the targets 30 are formed of different materials and a film is produced which comprises these different materials.

In one specific example, the sputtering device of an exemplary embodiment can be used to manufacture magnetic recording disks, such as hard disks. In most magnetic recording disks an alloy film of a recording layer magnetic film and a foundation film is produced. By way of example, a cobalt-chromium-tantalum (Co—Cr—Ta) alloy film is produced as the magnetic film. In addition, a cobalt-chromium (Co—Cr) alloy film is produced as a foundation film. In the case of an alloy film such as this, there are times when targets 30 which are formed from such alloys are used, and when a plurality of targets 30 each of a different material, such as a target 30 made of Co, a target 30 made of Cr, and a target 30 made of Ta, are used.

In a case such as this, if the targets 30 are not revolved, the film can have a large Co component accumulate on the surface section of the substrate 9 close to the target 30 made of Co, a large Cr component accumulate on the surface section of the substrate 9 close to the target 30 made of Cr, and a large Ta component accumulate on a surface section of the substrate 9 close to the target 30 made of Ta. That is to say, a film of very non-uniform components will be produced. However, such problems do not occur when the targets 30 are revolved in keeping with the exemplary embodiment of the present invention, and a good quality film of uniform component distribution can be produced.

It will be noted that, the fact that a plurality of targets 30 are provided at equal intervals along the circumference coaxial with the central axis of the substrate 9 is significant in that, by the deployment of the targets 30 equidistant with respect to the substrate 9, a more uniform film can be produced. However, in some cases this point is not always an essential condition, and there are times when the equal distance of the targets 30 from the substrate 9 is altered intentionally. By way of example, in the case of targets 30 which comprise different material types and in which the material of one target 30 has a low sputtering rate (defined as the number of sputtered particles emitted from the target 30 where ions of the same element fall incident) compared to another target 30, only the low sputtering rate target 30 is deployed to be in proximity with the substrate 9.

In addition, the fact that the power supplied to the targets 30 by the power supply system can be controlled independently has a marked effect in increasing the uniformity of the film. By way of example, as described above, in sputtering in which targets 30 of different material types are employed and where the sputtering rate of a certain target 30 is low, the power supplied to that target 30 will be increased. In other words, it is possible to compensate for the non-uniformity of the sputtering conditions in the targets 30, so that uniformity of the film is achieved, by independently controlling the power supply.

It will be noted that, the point described above applies to the magnet mechanism 5 as well. That is to say, using an electromagnet as the magnet mechanism 5, the electric current flow is independently controlled by the magnet mechanism 5. The strength of the magnetic field set in the discharge space in front of the targets 30 is independently controlled for each target 30. By virtue of this control, the film can be manufactured uniformly in the same way as described above.

An additional advantage of the sputtering device of the exemplary embodiment is that the magnet mechanism 5 turns as well as revolves, thus resulting in uniform erosion and increasing the lifespan of the target 30.

As is well known, the target 30 is eroded (erosion) during the sputtering process and the thickness thereof is gradually lessened. The degree of progress of the erosion, which is non-uniform in the direction of the surface of the targets 30, progresses quickly in places in which the sputtering discharge is performed at lower with high efficiency, and progresses slowly in places in which the sputtering discharge is performed at lower efficiency. The efficiency of the sputtering discharge is dependent on many factors including, for example, the distribution of the magnetic field from the magnet mechanism 5. Accordingly, in the case in which the magnet mechanism 5 is not turned, the erosion is fast in places of high magnetic field strength, and is slow in places of low magnetic field strength. For this reason, in places of high magnetic field strength in which the erosion progresses to the extent of the thickness of the target 30—whereby the lifespan of the target 30 is completed—there are times when a fairly large thickness remains in the position of low magnetic field strength. In this state the target 30 must be exchanged, whereby the material of the remaining section of the target 30 is not used for deposition of the film and is wasted.

In contrast, in the case in which the magnet mechanism 5 is turned, such as in the exemplary embodiment, the magnetic field strength is uniform over time (that is to say, the integrated magnetic field strength over time is uniform in the surface direction of the target 30), whereby the erosion of the target 30 progresses uniformly. For this reason, the lifespan of the target 30 can be extended and the amount of wasted target material can be reduced.

In addition, in the sputtering device of the exemplary embodiment, an auxiliary rotation mechanism uses the rotational power of the principal rotation mechanism to turn the magnet mechanism 5. This configuration has technological significance in that the rotational drive source and the rotational drive introducing system are integrated, whereby the mechanism is simplified in one body.

Figure 5:
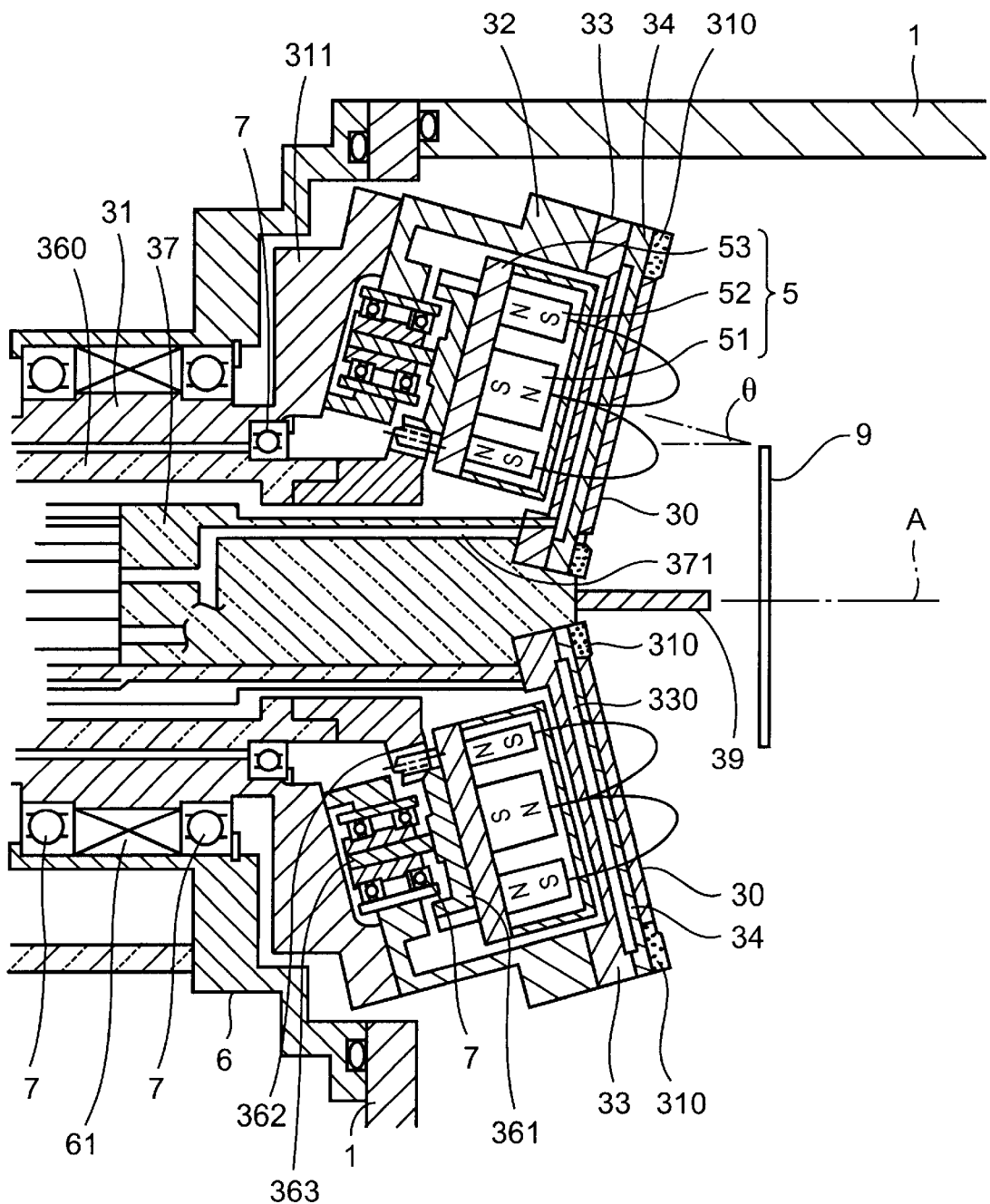
FIG. 5 is a side view schematic configuration of the main part of the sputtering device of a second embodiment.

FIG. 5 is a cross-sectional view of a second exemplary embodiment of a sputtering device. FIG. 5 depicts the main portion of the sputtering device including a cathode unit and a substrate. In this embodiment, the targets 30 are not parallel to the substrate 9 and are arranged in an inclined state. That is to say, as is clear from a comparison of FIG. 2 and FIG. 5, although the cathode-attaching frame 32, cavity plate 33, backing plate 34, target 30, magnet mechanism 5, subjugated gear 362 and axial pole 363 are mechanically identical to the first exemplary embodiment shown in FIG. 2, they are supported in an overall inclined state by a right holder flange 311. The angle of this incline is of the order of 15° taking the angle to the central axis A formed by the axial pole 363 as θ. (In FIG. 2 this angle is 0°).

In addition, a fixing gear 362 engages with a subjugated gear 361 in a diagonally inclined state. That is to say, the fixing gear 362 is a bevel gear configuration. Apart from this, the configuration is almost identical with the first exemplary embodiment.

In the sputtering device of the second exemplary embodiment, a target 30 is revolved, with respect to a static substrate 9, about the central axis of the substrate 9, depositing a uniform film on the surface of the substrate 9. The result thereof is remarkable in the case in which a plurality of targets 30 of different materials are used, and, because the magnet mechanism 5 is turned as well as revolved, it is possible for the lifespan of the target 30 to be extended.

Furthermore, the arrangement of the targets 30 in the second exemplary embodiment increases the usage efficiency of the target 30. When the target 30 is parallel with the substrate 9, as in the first exemplary embodiment, some sputtered particles that are emitted from the targets 30 do not reach the substrate 9 and are not used in film deposition. Although this problem is solved if the target is arranged coaxially with respect to the substrate 9, it is more problematic when a plurality of targets 30 are to be employed simultaneously. If the plurality of targets 30 are arranged diagonally, as shown in the second exemplary embodiment, the usage efficiency of the targets 30 can be maintained at a high level.

Figure 6:
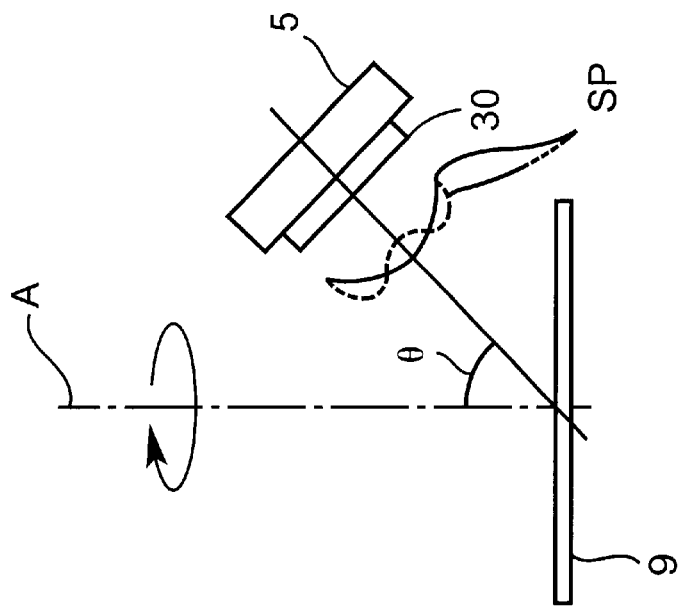
FIG. 6 depicts the film thickness distribution achieved by (1) a target arranged parallel to and coaxial with a substrate and (2) a target arranged eccentric to the central axis and diagonal with respect to the substrate.
Figure 6:
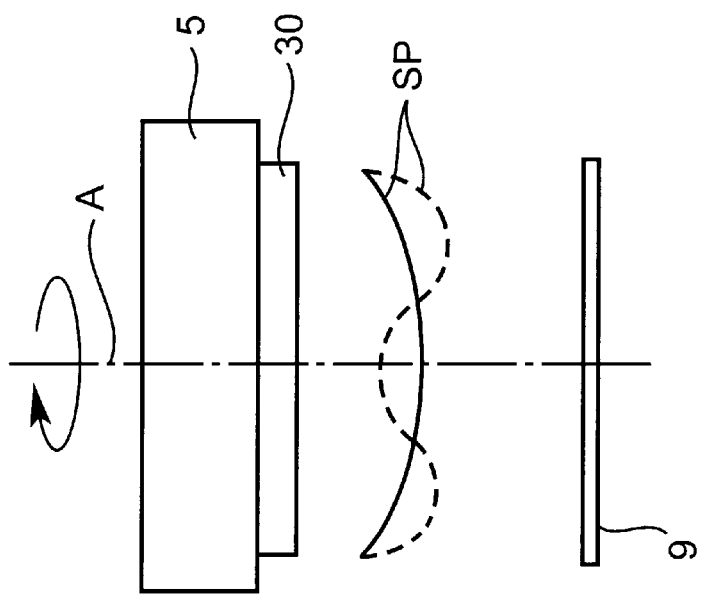

The configuration in which the target 30 is arranged diagonally to the substrate 9 and revolved has particular technological significance in cases in which only one target 30 is used. This point is described with reference to FIG. 6 in which the film thickness distribution control based on the diagonal arrangement and revolution of the target 30 is depicted. FIG. 6 (1) shows an example in which the target 30 is arranged parallel and coaxial with the substrate 9, and FIG. 6 (2) shows an example, in keeping with the second exemplary embodiment, in which the target 30 is eccentric to the central axis of the substrate 9 and is diagonally arranged with respect to the substrate 9 and revolved.

The amount of sputtered particles emitted from the target 30, which is non-uniform in the direction of the surface of the target 30, has a specific distribution, referred to as the "sputtering profile" and shown as SP in FIG. 6. The relationship between the emitted angle of the sputtered particles and the amount of sputtered particles follows, generally, the cosine law. Accordingly, the sputtering profile is large in the region of the central axis of the target 30 and becomes smaller as a function of the distance from the central axis. However, depending on the material of the target 30 there are exceptions. For example, as shown by the broken line in FIG. 6, a sputtering profile also exists that has a shape which is largest in the region of 45° to the central axis of the target 30.

In any case, as in FIG. 6 (1), if the target 30 is caused to rotate when the target 30 is coaxial to the substrate 9, the effect of the sputtering profile is not abated and the formation of a uniform film becomes difficult. However, as shown in FIG. 6 (2), when the target 30 is eccentric from the substrate 9 and is inclined to the substrate 9 and revolved, the effect of the variations of the sputtering profile can be reduced and the formation of a more uniform film can be achieved. Because the angle of incline θ of the target 30 with respect to the substrate 9 has an effect on the composition distribution and film thickness distribution of the film that is produced, it is desirable that the angle of incline θ be set, as appropriate, such that the effect thereof is uniform. In addition, although it is desirable that the central axis of the target 30 intersect the surface of the substrate 9 at the center of the surface of the substrate 9, there are times when the intersection is in an offset position. It will be noted that, the film thickness distribution control, such as that described above, can be effective even in cases in which only one target 30 is used. Further, other embodiments can result in reductions in the effects of the variations of the sputtering profile and can form uniform films. For example, an embodiment in which the central axis of the target is parallel to but offset from the central axis of the surface of the substrate can be used.

Figure 7:
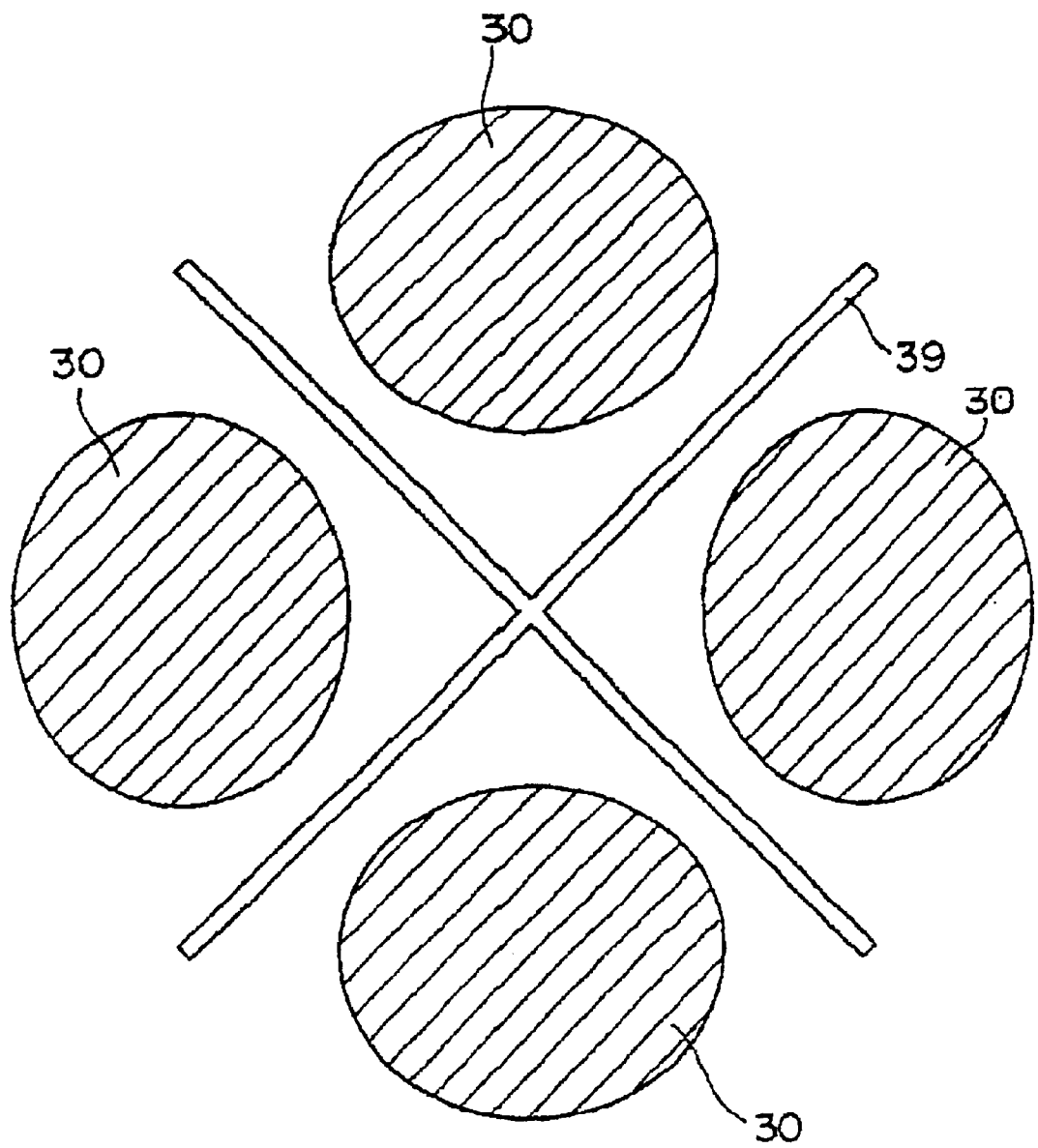
FIG. 7 is a side view of the partition plate of FIG. 5.

In addition, the second exemplary embodiment reduces and/or prevents mutual contamination (cross contamination) of the targets 30. As shown in FIG. 5, the targets 30 are partitioned by a partition plate 39 fixed to the main spindle 37 and the cavity plate 33. FIG. 7 is a side surface view that describes the configuration of the partition plate 39 shown in FIG. 5. As shown in FIG. 7, the partition plate 39 is provided so as to partition the space in which the targets 30 are provided. Because four targets 30 are provided in the present embodiment mode, the partition plate 39 forms a cross shape. The center of this cross lies on the central axis A shown in FIG. 5. Although a cross shape partition plate 39 is shown, other configurations are envisioned depending on the number and spacing of the targets 30.

In FIG. 5 and FIG. 7, a problem of cross-contamination between the targets 30 arises if no partition plate 39 is provided. That is to say, there are times when the sputtered particles emitted from one target 30 attach to another target 30. Even though the sputtered particles from another target 30 are attached and are sputtered again and emitted. This is undesirable because in a multiple target environment with different target materials, cross-contamination results in a material emitted that is not the original material of the target 30. When this occurs, the satisfactory control of the film components to be produced is difficult, and a film of non-uniform component distribution is liable to be produced. A partition plate 39 is therefore provided so the attachment of sputtered particles emitted from one target 30 to another target 30 is controlled. Accordingly, the cross-contamination as described above is prevented.

Figure 8:
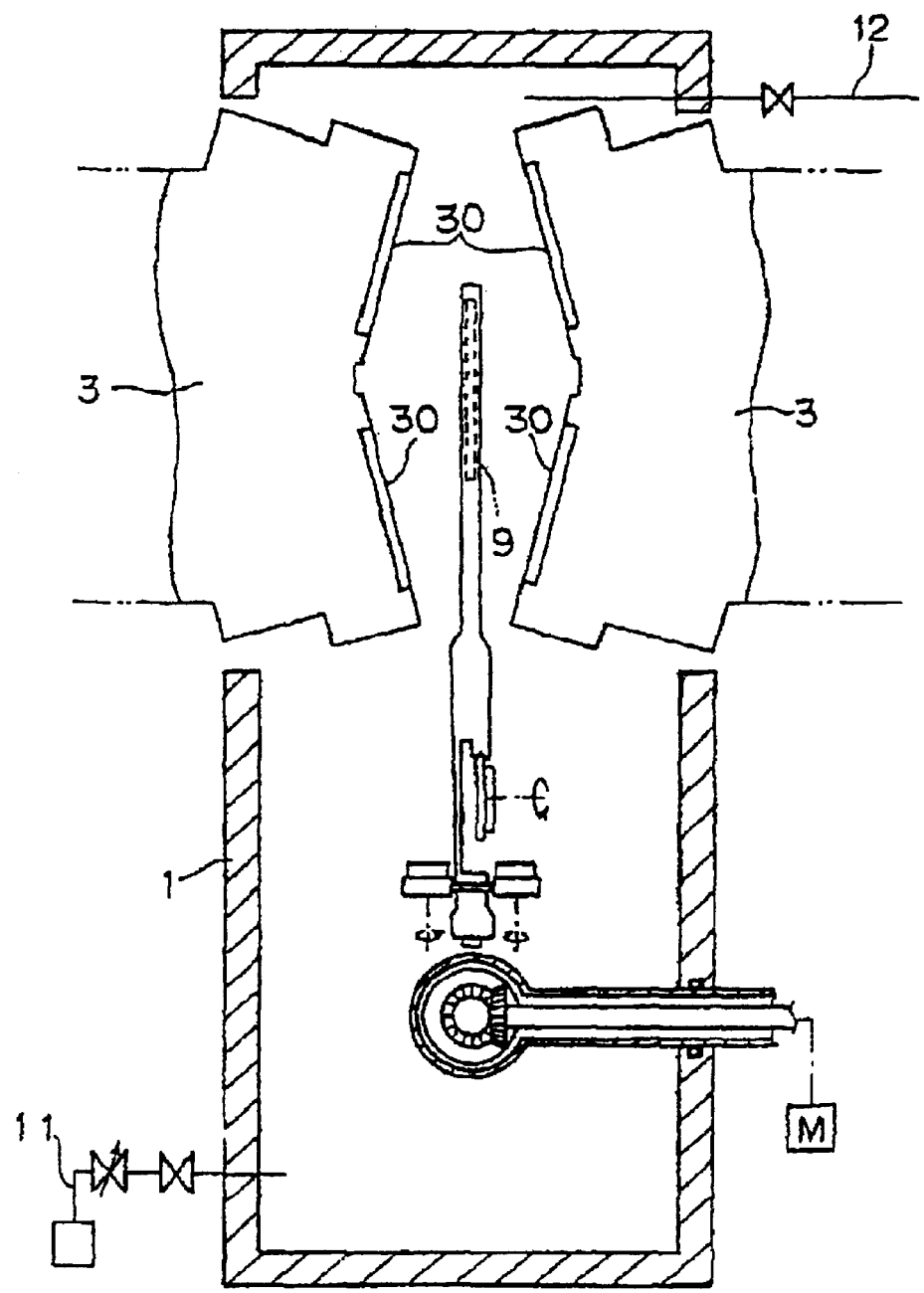
FIG. 8 is a cross-sectional schematic view of a configuration of a further embodiment of a sputtering device.

FIG. 8 is a cross-sectional view of a third exemplary embodiment showing a schematic configuration of a sputtering device in which cathode units 3 are arranged in both sides of the substrate 9, and the cathode units 3 form a configuration in which a plurality of targets 30 are arranged diagonally with respect to the substrate 9. The configuration of the cathode units 3 is identical to that of the second exemplary embodiment and so the description thereof has been omitted. In addition, a substrate carrier 2 supports the substrate 9 in the same way as shown in FIG. 1.

The device of the third exemplary embodiment, which is the same as the device of the first and second exemplary embodiments, is very suitable for application in inline devices, specifically, the exemplary embodiments are very suitable for the manufacture of magnetic recording devices such as hard disks. In addition to substrates for magnetic recording disks, semiconductor wafers for LSI manufacture, and glass substrates for liquid crystal display and plasma display can be adopted as objects for film formation. The exemplary embodiment results in simultaneous film deposition on both sides of the substrate 9, a uniform film deposition and an increase in the usage efficiency of the targets 30.

In the device of the embodiment modes described above, there is no need for a plurality of targets of different materials and a plurality of targets of the same material may be employed. This case also has the effect of affording uniformity of the film characteristics such as the film thickness, and of improving the film deposition rate on the whole.

The exemplary embodiments of the present invention has many advantages. For example, because the targets are arranged in a position offset from the central axis of the substrate and are rotated about an axis of revolution coaxial with the central axis of the substrate, a uniform film can be produced without need for rotation of the substrate. In addition, because the targets are provided in plurality, an effect is obtained whereby the uniformity of the film is improved and the film deposition rate is improved. Further, because the power supply to the targets can be controlled independently, the non-uniformity of the sputtering conditions on the targets can be compensated and thereby providing an even more uniform film deposition can be achieved.

In an embodiment in which to the targets are arranged in a predetermined inclined angle with respect to the substrate, an even more uniform film can be deposited by the selection of an angle correspondent with the sputtering profile.

In addition, to the high efficiency performance and high speed sputtering by the use of magnetron discharge, in an embodiment in which the magnet mechanism is rotated integrally with the targets, an effect is provided by which even more uniform film deposition is achieved and in which the effect of the magnetic field can be used without wastage. Also, because the magnetic field from the magnet mechanism is asymmetrical with respect to the central axis of the targets and the magnet mechanism is rotated about the central axis of the targets, the erosion of the targets is uniform. For this reason, the lifespan of the targets can be extended.

Also, because the film can be formed simultaneously on both sides of the substrate, compared to a case in which the film is deposited on only one side, an effect is obtained whereby the productivity can be improved and the sputtering device can be reduced in size. In the exemplary embodiments, the rotation-introducing mechanism is simplified because the auxiliary rotation mechanism rotates the magnet mechanism using the rotational power of the principal rotating mechanism.

Although the present invention has been described in connection with exemplary embodiments thereof, it will be appreciated by those skilled in the art that additions, deletions, modifications, and substitutions not specifically described may be made without departing from the spirit and scope of the invention as defined in the appended claims.

What is claimed is:

1. A sputtering device comprising:
   a substrate carrier for supporting a substrate with a central axis;
   a target holder arranged opposite the substrate carrier for holding a plurality of targets;
   a principal rotating mechanism for rotating the target holder with respect to the substrate about an axis of revolution; and
   a magnet provided for each of the plurality of targets, wherein each of the magnets is driven so as to rotate with respect to the target holder;
   wherein the plurality of targets are sputtered by a sputtering discharge to produce a film of a target material on at least a first surface of the substrate.

2. The sputtering device according to claim 1, wherein the plurality of targets are disposed on the target holder such that an axis of each of the plurality of targets is offset from the axis of revolution.

3. The sputtering device according to claim 1, wherein the axis of revolution of the principle rotating mechanism is coaxial with the central axis of the substrate.

4. The sputtering device according to claim 1, wherein the axis of revolution of the principle rotating mechanism is oblique with the central axis of the substrate.

5. The sputtering device according to claim 1, wherein the axis of revolution of the principle rotating mechanism is parallel with the central axis of the substrate.

6. The sputtering device according to claim 1, wherein each of the plurality of targets is disposed on a circumference coaxial with the axis of revolution.

7. The sputtering device according to claim 1, wherein each of the plurality of targets is disposed at a predetermined angle to the substrate.

8. The sputtering device according to claim 1, wherein, the principal rotating mechanism integrates rotation of the magnets with rotation of the target holder.

9. The sputtering device according to claim 8, wherein the magnets form a magnetic field asymmetrical to a central axis of each of the plurality of targets.

10. The sputtering device of claim 8, further comprising:
    an auxiliary rotating mechanism interconnecting the principal rotating mechanism with each of the magnets.

11. The sputtering device according to claim 10, wherein the auxiliary rotating mechanism rotates the magnets by using a rotational power of the principal rotating mechanism.

12. The sputtering device according to claim 1, wherein at least one cathode unit, each cathode unit comprising the plurality of targets and the principal rotating mechanism, is disposed on each side of the substrate carrier such that at least one cathode unit is vertically opposed by the first surface of the substrate held by the substrate carrier and at least one cathode unit is vertically opposed by a second surface of the substrate held by the substrate carrier.

13. A sputtering device comprising:
    means for supporting a substrate;
    means for holding a plurality of targets in a position that is offset from a central axis of the substrate; and
    first means for rotating the means for holding the plurality of targets with respect to the substrate;
    a magnet for each of the plurality of targets; and
    means for rotating each of the magnets with respect to the targets;
    wherein the plurality of targets are sputtered by a sputtering discharge to produce a film of a target material on at least a first surface of the substrate, and
    wherein each of the plurality of targets is disposed on the first means for rotating offset from an axis of revolution.

14. The sputtering device according to claim 13, wherein the axis of revolution is coaxial with the central axis of the substrate.

15. The sputtering device according to claim 13, wherein the axis of revolution is oblique to the central axis of the substrate.

16. The sputtering device according to claim 13, wherein the axis of revolution is parallel to the central axis of the substrate.

17. The sputtering device according to claim 13, further comprising:
    means for the magnetron discharge of the sputtering discharge,
    wherein, the means for the magnetron discharge rotates such that a magnetic field is formed asymmetric to a central axis of the at least one target.

18. The sputtering device according to claim 17, wherein the magnet rotating means rotates the magnets about a central axis of the respective target.

19. The sputtering device according to claim 13, further comprising:
    means to supply power,
    wherein the means to supply power is independently controlled to provide power for the sputtering discharge to each of the targets.

20. The sputtering device according to claim 13, wherein at least one cathode unit, each cathode unit comprising the means for holding the plurality of targets and the first means for rotating, is disposed on each side of the substrate such that at least one cathode unit is vertically opposed by the first surface of the substrate and at least one cathode unit is vertically opposed by a second surface of the substrate.

21. A method to sputter a film on a substrate comprising:
    affixing at least one substrate to a substrate holder;
    affixing a plurality of targets in a target holder such that the targets are offset from a central axis of the substrate,
    revolving the targets and a magnet mechanism provided for each of the targets about a first axis at a revolution speed;
    turning the magnet mechanisms with respect to the target holder at a turning speed; and
    supplying power to each of the targets to affect sputtering discharge.

22. The method of claim 21, wherein the first axis is parallel to the central axis of the substrate.

23. The method of claim 21, wherein the first axis is oblique to the central axis of the substrate.

24. The method of claim 21, wherein the first axis is coaxial to the central axis of the substrate.

25. The method of claim 21, wherein a ratio of the turning speed to the revolution speed is $\geq 1$.

26. The method of claim 21, further comprising:
    forming a magnetic field with the magnets, the magnetic field asymmetric about an axis of each of the magnets.

27. The method of claim 21, wherein the power is supplied independently to each of the targets.

* * * * *